Aug. 5, 1958 H. EPSTEIN ET AL 2,846,654

MAGNETOSTRICTIVE DELAY LINE

Filed June 25, 195.

2 Sheets-Sheet 1

INVENTOR
OSCAR B. STRAM
HERMAN EPSTEIN
BY Donald W. Phillion
ATTORNEY

INVENTOR
OSCAR B. STRAM
HERMAN EPSTEIN
BY Donald W. Phillion
ATTORNEY

United States Patent Office 2,846,654

Patented Aug. 5, 1958

2,846,654

MAGNETOSTRICTIVE DELAY LINE

Herman Epstein and Oscar B. Stram, Philadelphia, Pa., assignors to Burroughs Corporation, Detroit, Mich., a corporation of Michigan Application June 25, 1952, Serial No. 295,577

2 Claims. (Cl. 333—30)

This invention relates generally to improvements in pulse delay devices and more particularly to improvements in pulse delay devices utilizing magnetostrictive materials to effect the pulse delay.

In the prior art there are many useful applications for pulse delay devices. For example, such devices are used in computing apparatus circuitry, telephone circuitry, servomechanisms, and many other applications. Several different kinds of pulse delay means have been developed including mercury delay lines, quartz delay lines, inductance-capacitance delay lines, magnesium alloy delay lines, and magnetic delay lines. Each of these pulse delay means has certain characteristics which limit its use to certain areas of application. For example, the inductance-capacitance or electric delay lines and the mercury delay lines have a delay time of the order of 1 to 40 microseconds. In many applications it is desirable to delay a pulse for intervals of time substantially greater than 40 microseconds. Both the mercury delay line and the quartz delay line require a high frequency carrier signal in order to operate. Such a requirement involves considerable external circuitry and presents certain other difficulties not present where a high frequency carrier signal is not used. Magnetic delay lines of present day designs can not be operated successfully much over a frequency of 40 kilocycles per second. The quartz and magnesium type delay lines have a common characteristic of high attenuation which is disadvantageous in certain applications.

It is known in prior art that certain materials exhibit magnetostrictive properties. More specifically, certain materials such as nickel, ferrites, or permendur (an alloy composed of approximately fifty percent iron and fifty percent cobalt), when pulsed with a magnetic field, will develop an acoustic wave therein which will travel along the material at a certain calculable speed depending on the chemical and physical properties of the nickel. The acoustic wave can be detected by transducer means comprising a means to produce a biasing magnetic field flux in the material and coil means adapted to detect a change in the flux resulting therefrom. A variation of the flux in the material is produced by the acoustic wave passing therethrough. This means of pulse delay requires no high frequency carrier signal and can be utilized to delay pulses in a range of from 3 or 4 microseconds to in excess of 1,000 microseconds.

An object of this invention is a pulse delay line means utilizing the principle of magnetostriction.

A further object of the invention is a commercially usable pulse delay line means utilizing magnetostrictive means.

Another object of the invention is a rugged, inexpensive pulse delay line means utilizing magnetostrictive material.

A further object of the invention is a rugged, commercially useful magnetostrictive delay line capable of delaying pulses over a range of time intervals extending from two or three microseconds to time intervals in excess of 1,000 microseconds.

A further object of the invention is a pulse delay line means utilizing magnetostrictive material and requiring no high frequency carrier signal.

Another object of the invention is the improvement of pulse delay line means generally.

In accordance with one embodiment of the invention an elongated tubular member of magnetostrictive material has a first transducer means associated therewith to introduce acoustic waves therein. Second transducer means is positioned a predetermined distance from said first transducer means and is adapted to detect acoustic waves in said elongated tubular member and transform them into electrical signals. Echo suppression means is provided at both ends of the elongated tubular member to prevent acoustic reflections which might cause spurious signals or a low signal-to-noise ratio. In accordance with one feature of this invention the tube transmitting the acoustic waves is shaped in a helical manner to provide compactness and a rigid, substantially self-supporting, structure. Means are provided to vary the distance between the input transducer and the output transducer so that different time delays can be effected.

These and other objects and features of the invention will be more clearly understood from the following detailed description when read in conjunction with the drawings in which.

Figure 1:
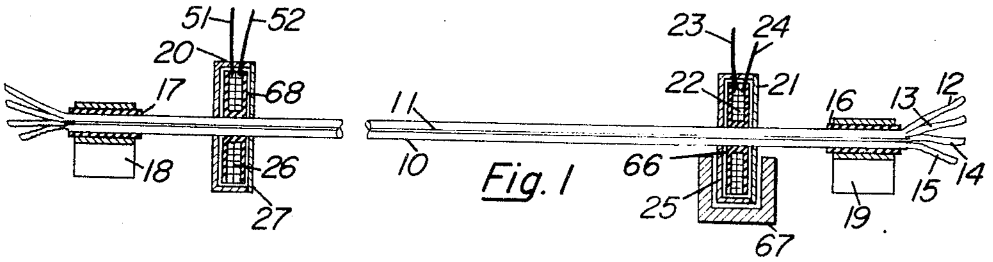
Fig. 1 is a plan view of one embodiment of the invention in which the magnetostrictive material comprises a substantially straight section of nickel tubing having a slit therein along the direction of its axis.

Referring now to a preferred embodiment of the invention shown in Fig. 1, nickel tubing 10 has an outside diameter of .125" and a wall thickness of .004". The length of the tube is constructed in accordance with the time delay desired and can be from a few inches to several feet long. The tube is slotted along its length in order to reduce eddy currents. It is to be noted that when smaller diameter tubes are used no slots are required since the eddy currents are of a lesser magnitude. In this embodiment of the invention shown in Fig. 1 the slot 11 may have a width of about .032 inch. Echo suppression is achieved in this configuration by making four slits in each end of the nickel tubing, thus forming four leaves on each end of the tube, such as, for example, at the right of the drawing in Fig. 1, leaves 12, 13, 14, and 15. Irregularities in the lengths of the slits and kinks in the leaves set up many reflections of different modes of vibration and in random phase relationship which substantially cancel each other out leaving only a small random noise present in the system. As a further aid in echo suppression a portion of the nickel tube adjacent the leaves at either end of said nickel tube is coated with an echo suppression material such as the beeswax coating 16 shown at the right side of the drawing of Fig. 1. At the left side of the drawing of Fig. 1 beeswax coating 17 is applied to the nickel tubing. It is to be noted that if a small diameter tubing is used the difficulty of forming leaves in the ends thereof is increased, and the application of beeswax to either end of the nickel tubing has been found to be sufficient to produce satisfactory echo suppression. Also, other methods of echo suppression well known in the art may be used.

Clamps 18 and 19 fit around the beeswax and provide a means of securing the pulse delay line in a desired position on a base (not shown). Input transducer 20 and output transducer 21 are substantially identical in construction in this preferred embodiment of the invention with the exception that a magnetic biasing source is provided for transducer 21. Referring specifically to output transducer 21 the coil 22 is wound in the form of a solenoid and positioned so as to encircle the nickel tubing 10. Conductors 23 and 24 are the terminals of winding 22. The winding 22 is encased on every side except its outer cylindrical surface by a fiber container 66. The fiber encased winding is then encased on every side except its inner cylindrical surface by cylindrical structure 25 which is of a magnetic material and provides a path for the flux generated by a magnetic biasing source to be described hereinafter. This encasing element 25 preferably should be of a magnetic material having good high frequency response characteristics. The various types of ferrite materials have such characteristics. Other magnetic materials may be used which have suitable high frequency response characteristics. A permanent magnet 67 is provided, in this instance, to create a biasing axial magnetic flux in that portion of the magnetostrictive tubing encircled by the output transducer 21.

Input transducer 20 is comprised of a winding 26, a fiber container 68, and an encasement element 27 similar respectively to the winding 22, the fiber container 66, and the encasement element 25 of output transducer 21.

Figure 4:
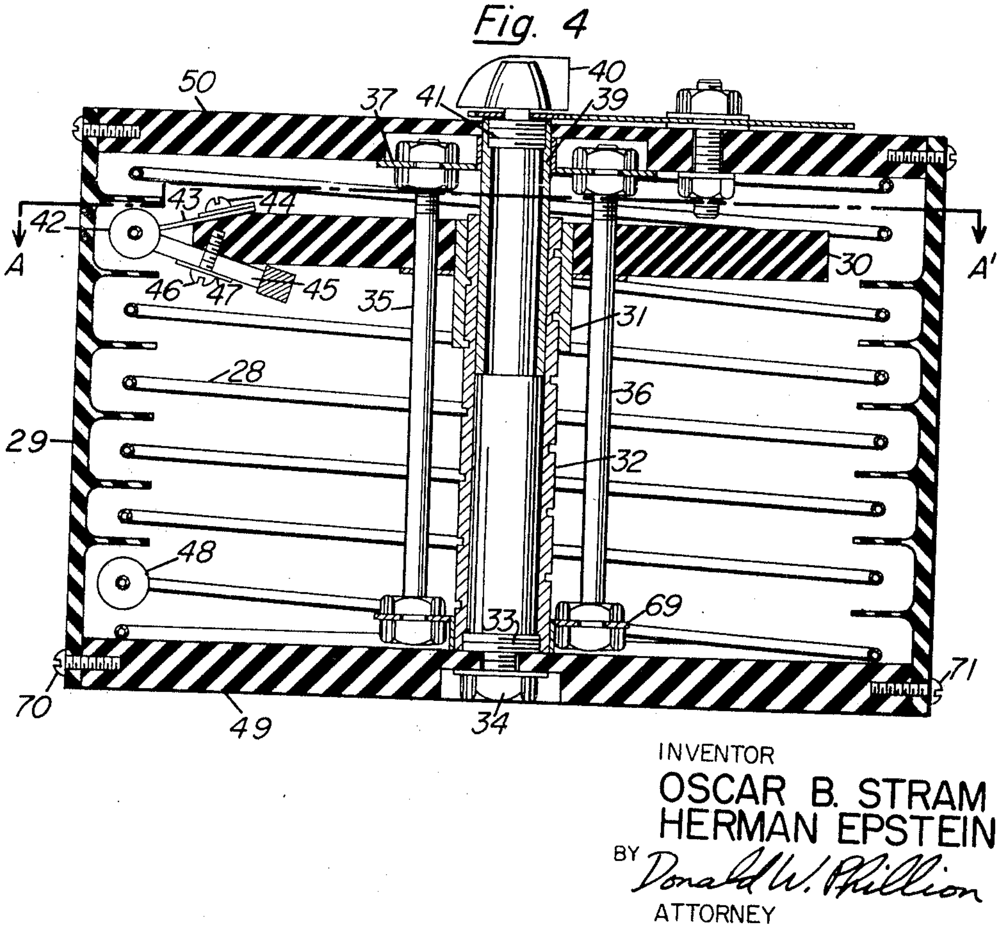
Fig. 4 illustrates a sectional view of an embodiment of the invention.

Referring now to Fig. 4 there is shown a perspective view of another preferred embodiment of the invention. Nickel tubing 28 is arranged in a helical fashion within the non magnetic container 29. As in the linear arrangement of a delay line described in connection with Fig. 1, reflection or echo suppression means (not seen in Fig. 4) may be provided at both ends of the tubing. In this preferred embodiment of the invention the nickel tubing has an outside diameter of .045″ and a wall thickness of about .002″. The radial distance of the helical arrangement is 4⅜″. Although nickel, which has suitable magnetostriction characteristics, is used in this embodiment of the invention, other materials having magnetostrictive characteristics are also suitable for use herein. Non-magnetic arm 30 is fastened to brass nut 31. Brass nut 31 has a helical thread in its inner surface to mate with the helical groove of lead screw 32. The lead screw 32 is securely fastened to the base of the container 29 by means of brass hub 33 and brass hex nut 34. To assure rigidity of arm 30 brass rods 35 and 36 which are secured to flanges 37 and 69 are caused to pass through apertures provided therefor in arm 30. Flange 37 is force fitted to bushing 39 and flange 69 is adapted to rotate about lead screw 32. Bar knob 40 is secured to element 41 which in turn is rigidly fastened to bushing 39.

When the bar knob is turned, flange 37 is turned, causing the arm 30 to turn. Since lead screw 32 is rigidly secured to the container 29 and is non-rotatable and also since the arm 30 is caused to follow a helical path in accordance with the helical grooves in lead screw 32 and the helical thread in the brass nut 31 which have the same pitch as the helical arrangement of the nickel tubing 28, the ends of the arm 30 will always maintain a constant physical relationship to that portion of the nickel tubing to which they are adjacent.

At one end of the arm 30 there is located a transducer 42 encircling tube 28 which is secured to the arm 30 by means of terminal board 43. Due to the rigidity of the tubular helix, supports are required only adjacent the ends thereof leaving the intermediate portion of the helix free from encumbrances as encircling transmitting transducer 42 slides thereover. The terminal board 43 is secured to the arm by means of bolt 44 and the transducer is secured to the terminal board by some appropriate means as, for example, a clamp or an adhesive. Permanent magnetic flux bias is provided by permanent magnet 45, the poles of which are spaced on either side of the transducer 42 and terminate close to the nickel tubing 28. This permanent magnet 45 is securely fastened to the arm 30 by means of bolt 46 and clamp 47. The transducer 48 is permanently secured in one position upon the nickel tubing.

The base 49 of the container 29 is secured thereto by an appropriate means such as bolts or screws 70 and 71. Similarly, the top portion 50 of the container 29 is fastened by some such means as screws, bolts, or other appropriate means. Both sections of the elements 49 and 50 are of non-magnetic material such as a phenolic or a ceramic.

Figure 5:
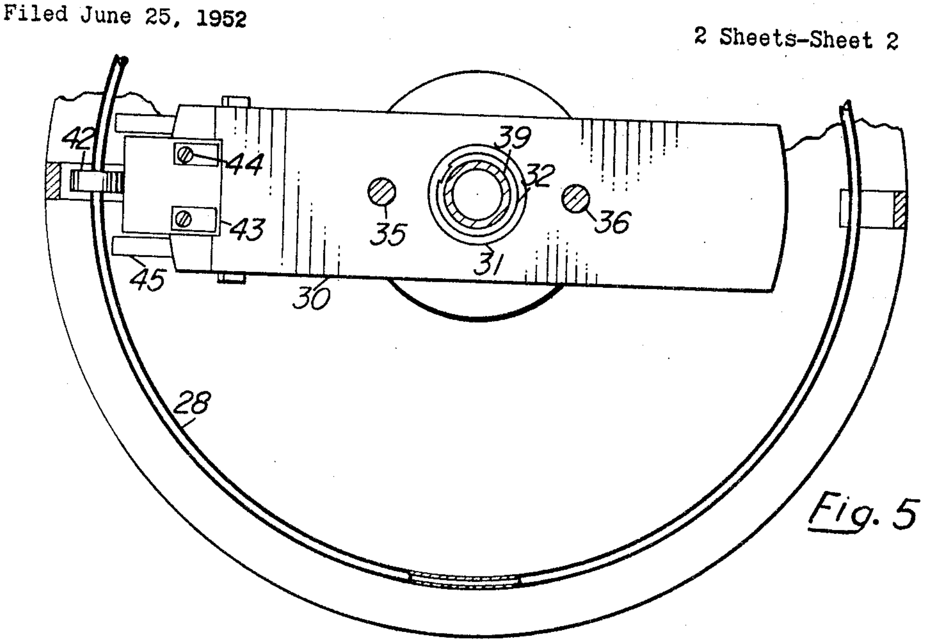
Fig. 5 represents a sectional view of the structure shown in Fig. 4 taken along line A—A'.

Referring now to Fig. 5 there is shown therein a top view of the structure of Fig. 4 taken as a section along the line A—A′. The reference numbers chosen for the structure of Fig. 5 will be the same as the reference numbers used for corresponding parts of the structure shown in Fig. 4. Terminal board 43 is secured to arm 30 by means of screws such as screw 44. The transducer 42 is secured to the terminal board 43 by appropriate means such as a clamp, adhesive means, or other suitable means in such a manner that the nickel tubing 28 passes through the aperture in the transducer 42. Permanent magnet 45 is positioned so that its two poles lie on opposite sides of the transducer 42 and adjacent the nickel tubing 28. Brass rods 35 and 36 pass through the apertures provided therefor in the arm 30. The arm 30 is secured to brass nut 31 which has helical threads on its inner surface which mate with the helical grooves on the outer surface of lead screw 32. Bushing 39 corresponds to bushing 39 of the structure shown in Fig. 4.

Figure 6:
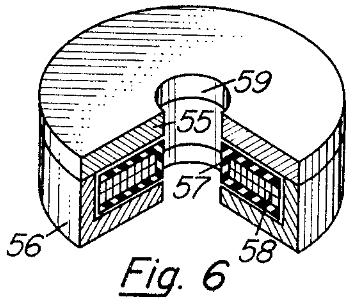
Fig. 6 shows a perspective view, with a portion broken away, of a transducer used in the structure of Figs. 1 and 4.

In Fig. 6 there is shown a detailed perspective view of a generally annularly shaped or ring-like transducer employed in the embodiments of the invention illustrated herein having a portion thereof broken away. For purposes of assembly the casing of the transducer which preferably is of a ferrite material is composed of two parts 55 and 56 which, after assembly, are held together by some adhesive means such as polystyrene. It is to be understood that materials other than ferrites may be used provided they have suitable magnetic properties. As mentioned hereinbefore, the high frequency response of the magnetic material is one of the more important characteristics. Inside the casing is a circular fiber element 57 which contains a coil 58. The coil in one embodiment is composed of 250 turns of A. W. G. #40 wire. The overall outside diameter of the transducer is $1\frac{1}{16}$″. The thickness of the walls of the ferrite casing is $\frac{1}{16}$″. The thickness of the walls of the fiber container is $\frac{1}{64}$″. The axial length of the transducer is about $\frac{13}{64}$″. The aperture 59 is provided for the magnetostrictive nickel tubing element to pass therethrough and its diameter is determined thereby. It is to be noted that the materials and the dimensions given herein for the transducer constitute but one engineering design of such a transducer and many variations may be made in such a design while maintaining suitable results.

Figure 7:
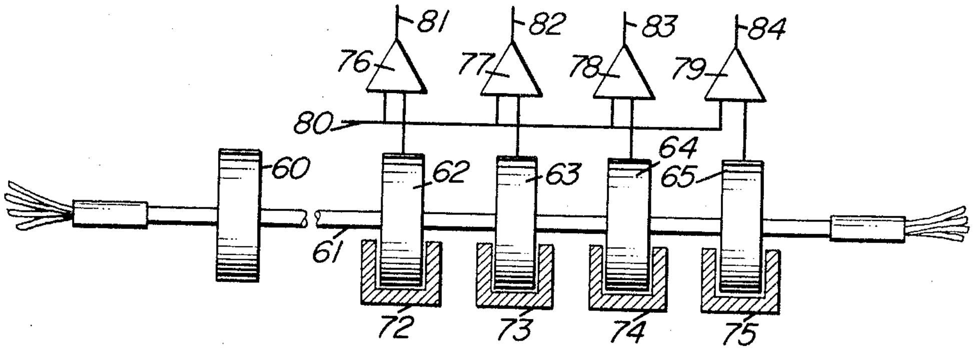
Fig. 7 is a view of an embodiment of a device adaptable to pulse distribution or to serial input-parallel output operation.

Fig. 7 shows a species of the invention whereby serial input-parallel output distribution may be achieved. This species of the invention is described and claimed in applicants' copending application for patent Serial Number 577,493, filed April 11, 1956, and assigned to the same assignee as the present application. Signals are introduced into input transducer 60 to produce an acoustic wave in the magnetostrictive tubular element 61. Output transducers 62, 63, 64, and 65 can be utilized as pulse distribution transducers or as a parallel output means of serially introduced input pulses applied to input transducer 60. Each output transducer has associated therewith a permanent magnet to provide an axial biasing magnetic flux in those portions of the magnetostrictive tubing encircled by the output transducers. More specifically, output transducers 62, 63, 64, and 65 have associated therewith permanent magnets 72, 73, 74 and 75 respectively. The output terminals of transducers 62, 63, 64, and 65 can be connected respectively to gate circuits 76, 77, 78, and 79. A conductor 80 common to all the gate circuits provides a timing pulse. Conductors 81, 82, 83, and 84 are the output terminals of gate circuits 76, 77, 78, and 79 respectively.

When used as a pulse distributor a single input pulse applied to input transducer 60 will create an acoustic wave travelling down nickel tube element 61 and passing output transducers 62, 63, 64, and 65 in that time order. Thus, depending upon the speed of travel of the acoustic wave and the spacing between the output transducers 62 through 65 pulses can be distributed from transducers 62 through 65 with a predetermined time interval therebetween. When used as a serial input-parallel output device, a train of pulses is introduced into input transducer 60 a predetermined time distance apart, and are caused to arrive opposite transducers 62, 63, 64, and 65 simultaneously. At this time gate circuits 76, 77, 78, and 79 connected to the outputs of transducers 62 through 65 can be opened by the application of an external timing pulse on conductor 80 and electrical pulses generated in the output transducers by the acoustic pulses appearing in the portion of nickel tubing encircled by the transducers 62 through 65 will flow through the open gate circuit and can be utilized in the desired manner.

Referring to Fig. 1 the operation of the device of the structure shown therein will be described.

This delay line operates in accordance with two well known magnetostrictive phenomena, the direct or Joule effect and the inverse or Villari effect, as well as the propagation of sonic energy in an elastic material.

When a pulse of current is fed into the transmitter coil, the build up and decay of magnetic flux in that part of the tube within the coil causes a longitudinal contraction in physical dimension in accordance with the Joule magnetostrictive effect. This elastic disturbance is propagated along the tube at the velocity of sound in nickel. (At average room temperature 4900 meters per second or 5.27 microseconds per inch.)

The Villari effect refers to a change in magnetization of a ferromagnetic material with strain. When the elastic disturbance reaches the portion of the tube within the receiving coil and in the field of a biasing permanent magnet it causes a change of reluctance of the magnetic line material resulting in a change of flux through the coil and a voltage is thereby induced in the coil. In this manner, a pulse fed into the transmitter at a given time will give rise to a pulse at the receiving coil at a later time, the delay being proportional to the distance between transmitter and receiver and to the speed of sound in nickel. Delays in excess of 1100 microseconds have been obtained and 2 microsecond pulses have successfully been recirculated at a clock frequency of 150 kilocycles, thus making a storage device with a capacity of 165 bits of information. Recirculation of pulses is obtained by a continuous regeneration and reshaping of the output pulse and application upon the input transducer.

Figure 2:
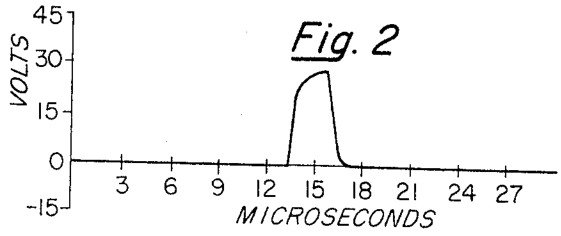
Fig. 2 shows a typical input pulse to the input transducer of the delay line.
Figure 3:
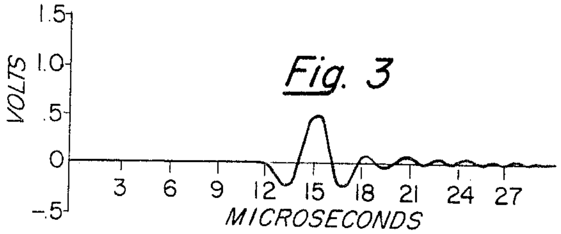
Fig. 3 shows a resultant output pulse from the output transducer of the delay line means.

In the specific structure shown in Fig. 1 assume that a 30 volt pulse shown in Fig. 2 and having a time duration of from 1 microsecond to 3.5 microseconds is impressed on the terminals 51 and 52 of transducer 20. The change of magnetic flux occurring within the nickel tubing causes an elastic disturbance in the nickel tubing. This elastic disturbance is propagated in both directions along the nickel tube. The propagation towards the left end of the nickel tubing of Fig. 1 is substantially damped out due to echo suppression means and becomes of small importance. The progagation to the right, however, passes through that portion of the nickel tubing which also acts as a path for the magnetic flux of the permanent magnetic biasing means 67 to cause a change in the magnetic flux passing through the nickel tubing. This change in magnetic flux induces a voltage in winding 22 of transducer 21 which can be detected by well known means. The magnitudes of this induced voltage are of the order of 0.5 volt as shown in Fig. 3.

In Fig. 1 the time delay line can be made variable simply by varying the distance between the input transducer 20 and the output transducer 21. Physically, this can be accomplished simply by sliding the output transducer along the nickel tubing until it is in the position which will give the desired delay time.

Referring now to Figs. 4 and 5 the principles of operation of the device shown therein are the same as described with respect to Fig. 1. However, in Figs. 4 and 5 the nickel coil is arranged in a helical manner and the output transducer 42 is adapted by means of arm 30 and the screw means of lead screw 32 and brass nut 31 to move along the helical path of the nickel tubing to vary the length of the tube between the output transducer 42 and the input transducer 48. Since the structure of the helix is sufficiently rigid so that supports intermediate the ends thereof are not required, transducer 45 can slide over tubing 28 without obstruction, and since its motion axially of the helix is guided by lead screw 32, this sliding introduces no strain in tubing 28 which might change the transmission characteristics thereof.

It is to be understood that the embodiments of the invention shown and described herein are but preferred embodiments of said invention and that various changes may be made in materials used, dimensions, and structural design without departing from the spirit or scope of the invention.

We claim:

1. In pulse control apparatus comprising an elongated tubular element of magnetostrictive material having each of the opposite end sections of the tubular element being deformed into a plurality of leaves, a transmitting transducer magnetically coupled to the tubular element, the transmitting transducer including an annular transmitting winding surrounding a relatively small section of the tubular element and a magnetic material surrounding the transmitting winding on the outer exposed surfaces of the latter, the magnetic material characterized by a high frequency response to the flux generated by the transmitting winding, the transmitting winding effective in response to an electrical stimulus applied thereto to establish longitudinal compressional stress waves for propagation towards opposite end sections within the tubular element, a receiving transducer magnetically coupled to the tubular element and spaced from the transmitting transducer and substantially the same length as the transmitting transducer in the direction of propagation along said element, the receiving transducer including a receiving winding surrounded by a high frequency responsive magnetic material both surrounding a section of the tubular element, and means for impressing a magnetic flux of a predetermined polarity within the section of the tubular element surrounded by the receiving transducer and thereby to cause the receiving winding to be responsive to propagating acoustic waves to derive an induced electrical stimulus delayed relative to the applied stimulus a time interval determined by the propagation time of said wave between the transmitting and receiving transducers, the leaves at the end sections deformed to set up a plurality of reflections upon the stress waves impinging thereon so as to substantially cancel one another.

2. In pulse delay apparatus the combination of a delay line of tubular section magnetostrictive material formed into a spaced turn helix, means terminating said line at the two ends thereof to produce reflected waves of plural modes and random phase having a low resultant amplitude at points along the line, said terminating means comprising a plurality of leaves of random configuration fixedly mounted by said delay line for vibration thereby, a pair of transducers each comprising a coil surrounding said line to provide magnetic coupling thereto, a lead screw having a pitch equal to that of said helix and fixedly mounted on said frame coaxial with the helix, a member threadably engaging said screw for relative displacement therealong, and means for supporting one of said transducers from said last member for guided displacement over a plurality of turns of said helix upon rotation of said member, said lead screw furnishing axial guidance for said displacement and said helix being unsupported from said frame over the portion thereof traversed by said one transducer.

References Cited in the file of this patent

UNITED STATES PATENTS

| | | |
|---|---|---|
| 2,328,496 | Rocard | Aug. 31, 1943 |
| 2,401,094 | Nicholson | May 28, 1946 |
| 2,495,321 | Gibbs et al. | Jan. 24, 1950 |
| 2,549,578 | Curtis | Apr. 17, 1951 |
| 2,552,139 | Bocciarelli | May 8, 1951 |
| 2,578,452 | Roberts | Dec. 11, 1951 |
| 2,612,603 | Nicholson | Sept. 30, 1952 |
| 2,629,770 | Sproule | Feb. 24, 1953 |
| 2,665,355 | Van Alen et al. | Jan. 5, 1954 |

FOREIGN PATENTS

| | | |
|---|---|---|
| 661,049 | Great Britain | Nov. 14, 1951 |

OTHER REFERENCES

Article, "Magnetostrictive delay line," by E. M. Bradburd, published in Electrical Communication, March 1951, pages 46–53.